United States Patent
Rothman

(12) United States Patent (10) Patent No.: US 7,619,240 B2
Rothman (45) Date of Patent: Nov. 17, 2009

(54) SEMICONDUCTOR PHOTODETECTOR, DEVICE FOR MULTISPECTRUM DETECTION OF ELECTROMAGNETIC RADIATION USING SUCH A PHOTODETECTOR AND METHOD FOR USING SUCH A DEVICE

(75) Inventor: Johan Rothman, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 331 days.

(21) Appl. No.: 11/290,950

(22) Filed: Nov. 30, 2005

(65) Prior Publication Data

US 2006/0131579 A1 Jun. 22, 2006

(30) Foreign Application Priority Data

Dec. 17, 2004 (FR) .................................. 04 53034

(51) Int. Cl.
*H01L 29/06* (2006.01)
*H01L 29/04* (2006.01)
*H01L 31/20* (2006.01)
*H01L 31/109* (2006.01)
*H01L 31/0336* (2006.01)

(52) U.S. Cl. ............................ 257/21; 257/53; 257/85; 257/183; 257/194

(58) Field of Classification Search .................. 257/21, 257/53, 20, 27, 187, 192–195, 19, 85, 260, 257/184–189, 262
See application file for complete search history.

(56) References Cited

U.S. PATENT DOCUMENTS

| 4,119,994 | A | 10/1978 | Jain et al. | |
|---|---|---|---|---|
| 4,390,889 | A | 6/1983 | Capasso et al. | |
| 5,068,524 | A | * 11/1991 | Elliott et al. | 257/188 |
| 5,113,076 | A | 5/1992 | Schulte | |
| 5,627,112 | A | * 5/1997 | Tennant et al. | 438/113 |
| 5,650,635 | A | * 7/1997 | Razeghi et al. | 257/21 |
| 5,731,621 | A | * 3/1998 | Kosai | 257/440 |
| 6,034,407 | A | 3/2000 | Tennant et al. | |
| 6,803,557 | B1 | 10/2004 | Taylor et al. | |
| 6,831,309 | B2 | * 12/2004 | Giboney | 257/184 |
| 2002/0011640 | A1 | 1/2002 | Bauer et al. | |
| 2003/0047752 | A1 | * 3/2003 | Campbell et al. | 257/186 |
| 2004/0036093 | A1 | 2/2004 | Gordon et al. | |

OTHER PUBLICATIONS

David L. Pulfrey, et al., "*High UV/Solar Rejection Ratios in GaN/AlGaN/GaN P-I-N Photodiodes*," IEEE Transactions on Electron Devices, vol. 48, No. 3, Mar. 2001, pp. 486-489.

Hsjung-Kuang Tsai, et al., "*Amorphous SiC/Si Three-Color Detector*," Appl. Phys. Lett. 52 (4), Jan. 25, 1988, pp. 275-277.

* cited by examiner

*Primary Examiner*—Chuong A. Luu
(74) *Attorney, Agent, or Firm*—Burr & Brown

(57) ABSTRACT

This semiconductor photodetector consists of a diode with at least two heterojunctions comprising two external layers, a first layer with a given kind or type of doping and a second layer with a kind or type of doping opposite to that of the first layer, the bandgap width of these two layers being determined as a function of the energy and hence the wavelength or wavelength band that they are each intended to detect, these two layers being separated from each other by an intermediate layer having the same kind or type of doping as one of said first and second layers, said diode being subjected to a bias voltage of adjustable value between the two external layers. The bandgap width of the intermediate layer is greater than that of the layer that has the same type of doping as layer.

10 Claims, 3 Drawing Sheets

SEMICONDUCTOR PHOTODETECTOR, DEVICE FOR MULTISPECTRUM DETECTION OF ELECTROMAGNETIC RADIATION USING SUCH A PHOTODETECTOR AND METHOD FOR USING SUCH A DEVICE

FIELD OF THE INVENTION

The invention primarily relates to a semiconductor photodetector consisting of one or more diodes with multiple heterojunctions.

The invention also relates to the use of such photodetectors in the context of implementing a device for multispectrum detection of electromagnetic radiation, i.e. a device capable of detecting several wavelengths or several wavelength bands of electromagnetic radiation simultaneously.

PRIOR ART

A photodetector according to the invention must have simultaneous sensitivity to at least two spectral bands, i.e. different wavelengths or different wavelength bands. A detection device that uses such detectors has a certain number of applications, especially in imaging in the infrared range.

In the context of detecting electromagnetic radiation, especially infrared radiation, the use of semiconductor photodetectors, especially diodes with multiple heterojunctions, is known. Such diodes consist of a stacked structure of layers of semiconductor material having at least two interfaces at or in the vicinity of a p-n junction.

A p-n junction consists, as is known, of a semiconductor device, one part of which is n-doped and the other part of which is p-doped, both these parts being separated by a so-called "junction" plane.

The use of a photodetector element as a semiconductor material results, as is known, in the emission of electron or hole type carriers when the material is subjected to incident radiation having sufficient energy and of a specific wavelength that is less than a value that is representative of the energy equivalent to the width of the bandgap and these carriers can then be collected by an electrical read-out circuit.

The principle of using multiheterojunction diodes is known. Among these, the commonest example is the p-i-n diode characterised by the presence of an intermediate intrinsic or near-intrinsic doped layer between two layers of n-doped and p-doped materials respectively without any variation in the bandgap width.

Such diodes are chiefly used for high-speed photodetection because they allow rapid removal of the photo carriers generated in the material of the i-type intermediate layer. Traditionally, the intermediate layer made of an i-type material is thicker than the two n-doped and p-doped layers respectively so that the majority of the photo carriers is therefore generated in said intrinsic i-type material. This being so, the diode is admittedly fast, but its quantum efficiency is low. Also, its use is more complicated.

It has also been proposed, in the publication entitled "*High UV/solar rejection ratios in GaN/AlGaN/GAN P-I-N photodiodes*"—D. L. Pulfrey et al —IEEE Trans. Electron Dev., 48, 486 (2001) for example, to replace the material that constitutes the intermediate layer by a material that is still an intrinsic I-type material but has a bandgap width variation, especially for applications in ultraviolet radiation detectors.

Such a dual heterojunction diode makes it possible to encourage growth of the materials that make up the external p- and n-doped layers that are made of gallium nitride (GaN) which has a smaller bandgap than that of the i-type material which is made of aluminium gallium nitride (AlGaN) for example.

Thus, the variation in the bandgap in these structures makes it possible to create potential barriers to the photo carriers generated in the n and p layers, thereby limiting detection of radiation at visible wavelengths.

This being so, it is mainly the photo carriers generated in the intermediate intrinsic material region that are detected.

Dual-spectrum photodiodes, i.e. photodiodes capable of detecting two types of wavelengths, that use a triple P-I-i-n type heterojunction in which the materials that constitute the P and I layers have bandgaps that are larger than the materials that constitute the i and n layers had been proposed.

In the example described in the publication H-K. Tsai et S6C. Lee, Appl. Phys. Letter, 52, 275 (1987), the materials that constitute the I and i layers are low-concentration n-doped so that the charge depletion area extends into them from the P-I interface.

The materials used are amorphous and have a relatively low mobility and diffusion length which limits collection of the photo carriers in the charge depletion area.

A dual-spectrum capability is ensured by extending this charge depletion area as a function of reverse biasing of the diode. Thus, under low bias the charge depletion area extends to a limited extent into the layer of I material that is sensitive to short wavelength values. In contrast, under higher bias, the charge depletion area also extends into the area of i material, thus making it possible to detect longer wavelength radiation.

Two types of electrical circuit and connection are used for diodes in the context of multispectrum detection using multiple diodes.

The first involves connecting diodes of the type in question in series. Document U.S. Pat. No. 5,113,076, for example, describes an electromagnetic radiation detector comprising two junctions that operate in a manner similar to two photodiodes mounted in a head-to-foot arrangement. Each of the photodiodes is sensitive to radiation in a different infrared spectral band.

Detection of a particular wavelength band is obtained by switching a bias voltage. The two photodiodes that constitute each of the pixels in question are connected in series and have a different cut-off wavelength $\lambda_1$ and $\lambda_2$.

The general principle of this approach therefore involves creating two p-n junctions which collect the photo carriers generated in the two semiconductor materials that have different bandgap widths and, consequently, cut-off wavelengths that are also different.

The materials capable of being used may, for instance, have the formula $Hg_{1-x}Cd_xTe$, with different cadmium compositions.

In the embodiment described, detection of electromagnetic radiation having different, discontinuous wavelengths or wavelength bands is possible in each junction given the fact that the junction that collects the photo carriers in the material having the shorter cut-off wavelength $\lambda_1$ is closer to the source of the photons. In fact, the materials used behave like high-pass filters. A layer of material having a cut-off wavelength $\lambda_2$ absorbs all wavelengths that are less than $\lambda_2$. In fact radiation comprising, for example, two wavelengths $\lambda_1$ and $\lambda_2$, where $\lambda_1 < \lambda_2$, and first passing through said material having a cut-off wavelength $\lambda_2$ will be absorbed by the latter and practically no radiation of wavelength $\lambda_1$ will reach the layer of material having a cut-off wavelength $\lambda_1$. In order to allow dual spectrum detection, it is therefore necessary to ensure that the radiation enters via the layer of material that has the shortest cut-off wavelength because the latter lets through all the higher wavelengths.

The major drawback associated with connecting diodes in series in this way is the fact that the architecture of the read-out circuit is made more complex because the two spectral bands are detected using currents in opposite directions.

This necessitates two integration sites per pixel, thus limiting the storage capacity, integration capacity and also the resulting performance of the detector, especially if pixel pitches are small.

Another type of architecture using independent photodiodes in which the diodes are independently electrically connected has been proposed.

Document U.S. Pat. No. 6,034,407, for example, describes such a dual spectrum detector that uses two connections per pixel, making it possible to read the two junctions simultaneously with temporal coherence. The material that constitutes each of the p-n junctions is selected so as to detect a specific wavelength or wavelength band that is a discontinuous from the wavelength or wavelength band that can be detected by the adjacent junction of that same pixel.

However, this duplication of interconnections imposes a limit on the minimum pixel pitch which is far in excess of that of series-connected diode setups. On the other hand, this approach makes it possible, in certain cases, to limit the extent of etching of the materials that constitute said diodes, therefore consequently improving the performance of the resulting detectors.

However, and as in the case of the series-connection approach, this results in a limited storage capacity.

The objective of the present invention is to overcome these various drawbacks.

SUMMARY OF THE INVENTION

The invention relates to a semiconductor photodetector, also consisting of one diode with at least two heterojunctions. Such a diode with a stacked structure comprises two external layers, a first p-doped layer and a second n-doped layer respectively, the bandgap width of these two layers being determined as a function of the energy and hence the wavelength or wavelength band that they are each intended to detect, these two layers being separated from each other by an intermediate layer having the same type of doping as one of said first and second layers, but with a bandgap width in excess of that of the layer in question, said photodetector being subjected to a bias voltage of adjustable value between the two external layers.

In other terms, the invention involves using, as a multispectrum photodetector, a multiheterojunction diode, the intermediate semiconductor layer of which acts as a switch that can be controlled by the voltage applied to the diode. In other words, the multiheterojunction diode makes it possible to detect two different spectral bands by switching between two detection modes.

Thus, at low-voltage, the junction that constitutes the diode remains spatially localised and is only sensitive to a first wavelength or wavelength band. In contrast, at higher voltage, the junction extends spatially into said intermediate layer that has a different doping and bandgap width and this makes it possible to detect, firstly, said first wavelength or wavelength band and, secondly, a second wavelength or wavelength band that is distinct and discontinuous from the first.

According to one aspect of the invention, the thickness of the intermediate layer is less than that of the two external layers.

Also, the concentration of the doping of the intermediate layer is less than that of the external layer which has a different type of doping.

According to one advantageous embodiment of the invention, the intermediate layer itself is subdivided into several sub-layers having the same kind or type of doping but having different doping concentrations and also different bandgap widths.

The invention also makes it possible to detect multispectrum electromagnetic radiation, i.e. radiation that includes more than two wavelengths or wavelength bands. In order to detect three wavelengths or wavelength bands, the photodetector uses two multiheterojunction diodes of the type described above connected in series.

Using such an architecture also makes it possible to detect four different wavelengths or wavelength bands by using the same principle.

The invention also relates to a device for detecting multispectrum electromagnetic radiation which involves using an array of photo detectors of the type described above.

Finally, it relates to a method for using the multispectrum detection device in question. This involves:

applying a first voltage in order to detect the photo carriers created in the external layer that is differently or oppositely doped to the intermediate layer;

then applying a second voltage having a value higher than that of said first voltage in order to detect the photo carriers created in the two external layers;

and, finally, subtracting the two quantities thus obtained in order to determine the number of photo carriers created by the second external layer.

The way in which the invention is implemented and its resulting advantages will be made more readily understandable by the following description of typical embodiments, given for information only and without limiting the scope of the invention, reference being made to the accompanying drawings.

DESCRIPTION OF THE PREFERRED EMBODIMENTS

Figure 1:
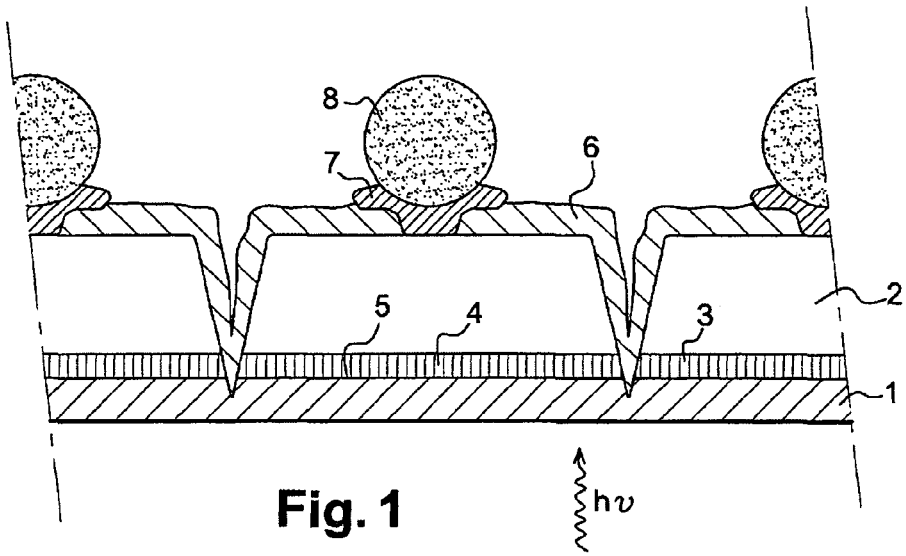
FIG. 1 is a schematic cross-sectional view of the array part of a multispectrum photodetector in accordance with the invention.

FIG. 1 shows part of a photovoltaic type dual spectrum detector. This is an array-type detector, each of the pixels of said array consisting of one photodiode having two heterojunctions.

Each diode firstly comprises two external layers (1) and (2) made of a semiconductor material having a different doping and bandgap width. In the example described, layer (1) which is closest to the source of radiation is p-doped and the other layer (2) is n-doped.

The two layers (1) and (2) are separated by a third layer (3) referred to as the intermediate layer which is also made of a semiconductor material with the same type of doping as layer (1). This being so, it forms a p-n junction on interface (4) which is the contact area between intermediate layer (3) and layer (2). The doping level of intermediate layer (3) is less than that of the layer (1) so that the space charge area extends mainly into the said layer (3).

The bandgap width of the intermediate layer (3) is greater than that of layer (2) in order to form a potential barrier on interface (5).

The various layers that make up the photodiode according to the invention are preferably produced by epitaxy, for example molecular-beam epitaxy. The pixels that make up the detection circuit are produced in the form of mesas which makes it possible to delimit the collection of photo carriers in the mesa structure.

Electrical insulation of each of the pixels from adjacent pixels is obtained by etching the mesas. In addition, mechanical and electrical protection is obtained by means of a layer (6) made of an insulating material that partially covers each of the mesas that constitute said pixels and the end of which penetrates into the outermost layer (1) of the basic substrate.

In the upper part of the mesas, electrical contact with layer (2) is obtained by means of a conductor (7) that subsequently allows hybridisation of the detection circuit consisting of such an array of photo detectors on a read-out circuit by means of indium beads (8). This technology is well known to those skilled in the art and there is no need to describe it here in greater detail.

Each photodetector therefore has two connections: the bead (8) and a contact on the rear surface of the substrate. The biasing circuit and the circuit for measuring the current created by the photo carriers, etc. are connected across these two terminals in a conventional manner.

The example of a photodiode shown in FIG. 1 is of the N-P-p type. It is understood that the invention also relates to the reverse configuration—P-N-n.

Each photodiode makes it possible to detect incident radiation in two different wavelength bands by using two different modes. A first mode detects radiation absorbed in layer (1) in a wavelength band $B_1 = \Delta\lambda_1$. A second mode makes it possible to detect incident radiation absorbed in layers (1) and (2) equivalent to a wavelength band $B_{1-2} = \Delta\lambda_1 + \Delta\lambda_2$.

Switching between these modes is obtained by extending the space charge area of the p-n junction through the potential barrier formed on the heterojunction between layers (2) and (3). The function of this potential barrier is to repel the photo carriers generated in layer (2), thereby preventing detection of radiation in wavelength band $\Delta\lambda_2$ when the photodiode is operating in mode 1.

Figure 2A:
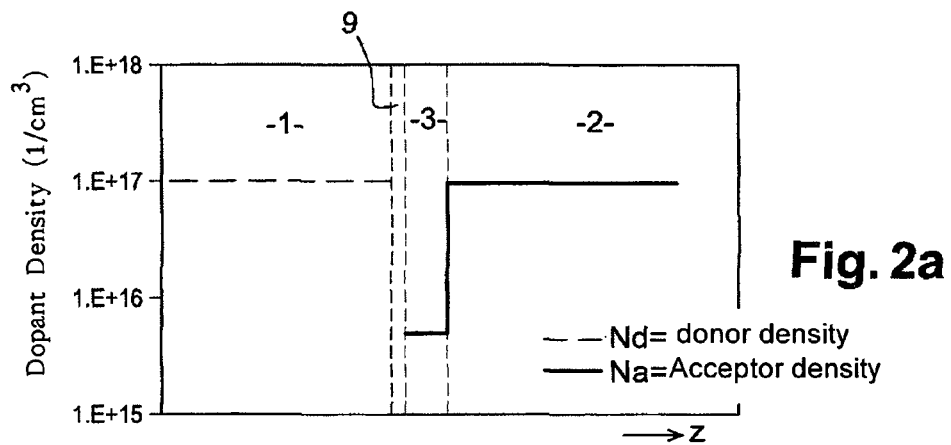
FIGS. 2a and 2b show, for a photodetector of the type shown in FIG. 1, the variation in the conductor density and bandgap width respectively, depending on the location where these quantities are measured relative to the heterojunction used in the context of the present invention.
Figure 2B:
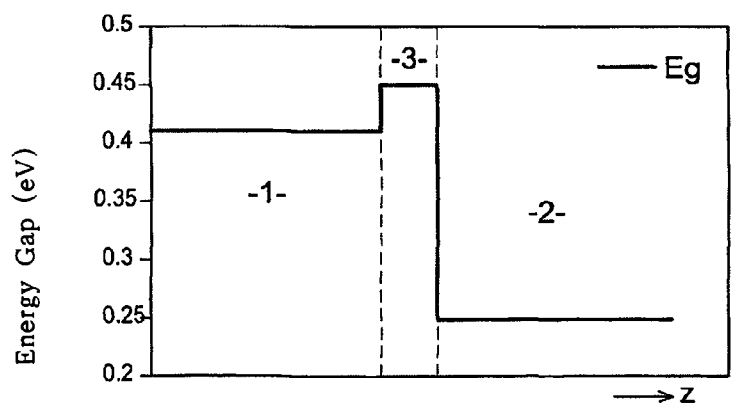

FIGS. 2a and 2b illustrate a typical example of dopings and bandgap widths depending on the position in the photodiode structure.

The thickness of intermediate layer (3) is selected so that space charge area (9) extends only partially across said layer (3) for low reverse bias values V (mode 1). When the photodiode is subjected to a sufficient reverse bias voltage (mode 2), the space charge area extends into intermediate layer (3) as far as layer (2), thereby allowing the photo carriers generated in layer (2), following absorption of the incident radiation, to cross the potential barrier, thus contributing to the photo current. Adjustment of this reverse bias voltage V thus makes it possible to obtain two operating modes:

mode 1: V<Vs: the photo current is dominated by the photo carriers generated in layer (1) doped oppositely to intermediate layer (3). The carriers generated in layer (2) are repelled from the p-n junction by the potential barrier formed on the interface (5) between layer (2) and intermediate layer (3) in accordance with a known principle of semiconductor technology. The photo carriers generated in layer (2) are consequently not collected. In the example of the embodiment shown in FIGS. 2a and 2b, the pixel in FIG. 1 only detects wavelengths $\lambda < \lambda_{c1}$ in this mode 1;

mode 2: V>Vs: extension of the depletion area as far as layer (2) allows the photo carriers to cross the potential barrier located on interface (5), thus making it possible to collect the photo carriers generated in this layer. Thus, in this mode, incident radiation is detected in two wavelength bands $B_1$ ($\lambda < \lambda_{c1}$) and $B_2$ ($\lambda_{c1} < \lambda < \lambda_{c2}$). The contribution of band B2 can be obtained by subtracting the contribution of band B1, measured in mode 1.

Figure 3:
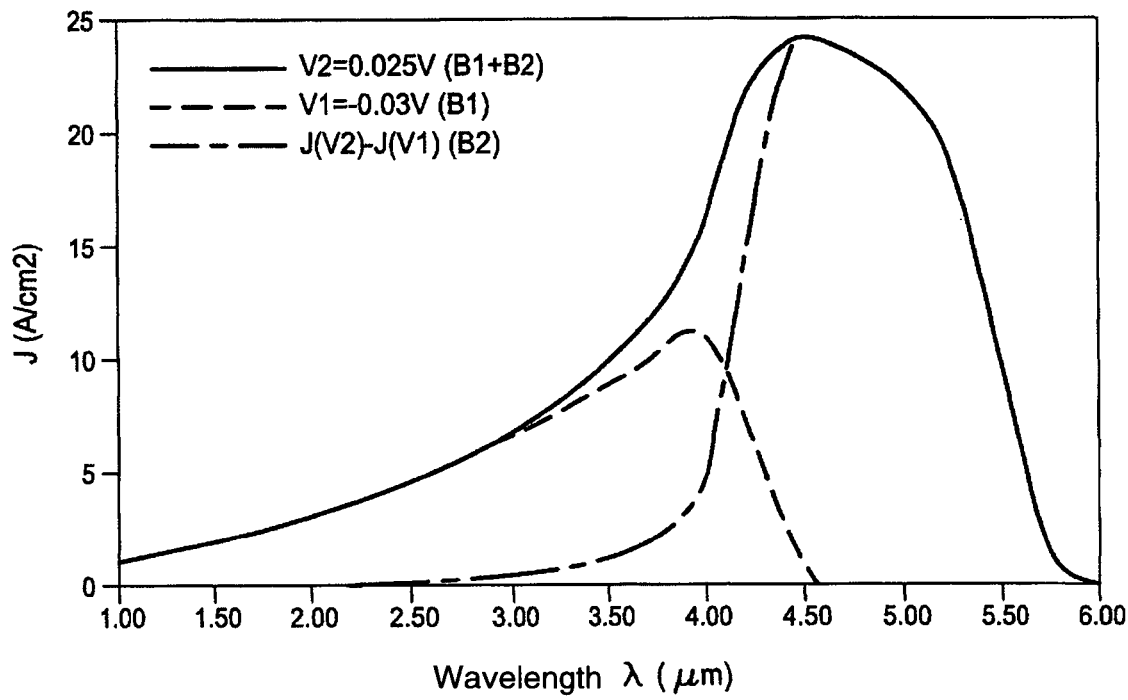
FIG. 3 is a graph that shows the current density resulting from detection by a photodetector in accordance with the invention of electromagnetic radiation as a function of two values of voltage applied to the photodetector and as a function of wavelength.

FIG. 3 shows an example of the spectral response for a photodetector that has a junction according to the invention:

when V=0.03 Volts, the detector operates in mode 1 and incident radiation is detected for $\Delta\lambda_1 < \lambda_{c1}$;

when V=0.25 Volts, the detector operates in mode 2 and detects radiation $\lambda < \lambda_2$;

the contribution of the band $\Delta\lambda_{c2}, \lambda_{c1} < \lambda < \lambda_2$ is estimated by subtracting the response in mode 1 and mode 2.

The invention differs from the prior art by combining variations in dopings and bandgap widths which ensure operation of the diode in question, $E_{g2} < E_{g1} \leq E_{g3}$ and $|N_3| < |N_2|$ and $|N_3| < |N_1|$, and in terms of the thickness of the various layers.

The doping of intermediate layer (3) is adjusted so that the space charge area extends only partially across the latter. This being so and in contrast to the prior art, this space charge area is confined to one interface for low bias voltage values.

Absorption of radiation takes place in layers (1) and (2) that are external relative to the intermediate layer (3). The thickness of the latter is less than that of layers (1, 2). In traditional structures of the p-i-n type, radiation is detected in the i region which is then thicker than at least one of the two external layers.

The doping levels are also chosen so that the potential barrier created on interface (5) is outside the space charge area for low bias voltage values.

In a second embodiment, mode 1 detects only band $B_2$ $\lambda_{c1} < \lambda < \lambda_{c2}$. Mode 2 still detects in both the bands and the contribution of band $B_1$, is still obtained by subtraction.

Figure 4:
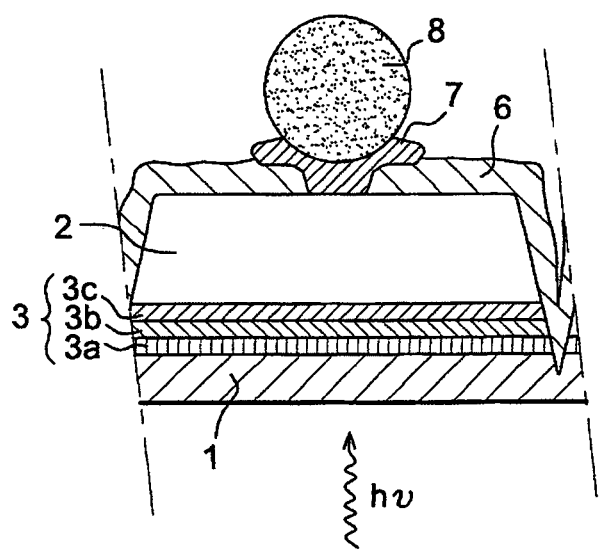
FIG. 4 is a schematic cross-sectional view of another photodetector in accordance with the invention.

In yet another embodiment of the invention as shown in FIG. 4, intermediate layer (3) is subdivided into several sub-layers, three in this case (3a, 3b, 3c), that have different doping levels and bandgap widths.

Figure 5A:
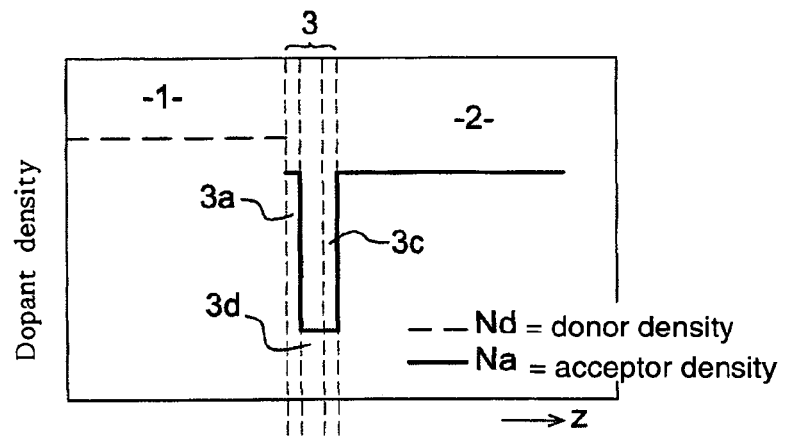
FIGS. 5a and 5b are graphs similar to those in FIGS. 2a and 2b, but in relation to the photodetector in FIG. 4.
Figure 5B:
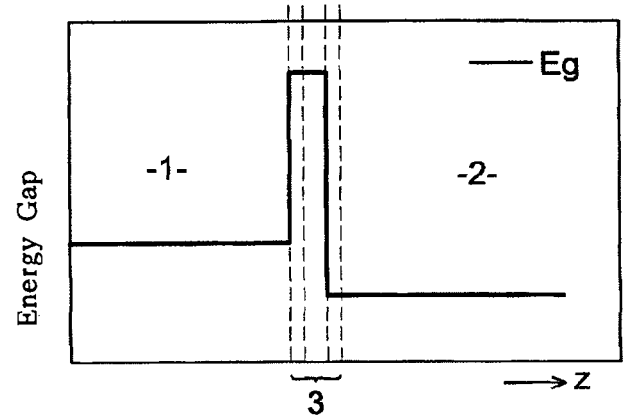

FIGS. 5a and 5b illustrate typical examples of dopings and bandgap widths depending on the position in the structure:

Thus, the highest doping level or concentration is located in area (3a), i.e. in the sub-layer that is in contact with external layer (1) that is differently or oppositely doped to it. This limits spatial expansion of the depletion area for low reverse bias voltage values. This limitation provides switching which is less dependent on the doping in the slightly doped areas (3b) and (3c). Limiting spatial expansion of the depletion area may also reduce the leakage current from layer (2) through the potential barrier.

The presence of area (3a) also makes it possible to vary the doping in areas (3b) and (3c) with greater freedom and this makes it possible to obtain mode switching for a lower bias voltage threshold value Vs.

Finally, area (3c) acts like a band-curvature area making it possible to cross the potential barrier on the interface between areas (3b) and (3c) at a lower bias value. This being so, the diode can operate more stably because possible electrical leakage is then limited (the reader is reminded that said leakage increases as the bias voltage increases).

Completed tests demonstrate that, using a photodetector produced by means of photodiodes in accordance with FIG. 4, switching in order to select spectral bands is more sensitive to bias and that, also, the bias voltage threshold value is lower than for a detector that uses photodiodes in accordance with FIG. 1.

With regard to the improvements in performance described above, using a detector that has at least three areas in intermediate layer (3) makes it possible to obtain switching that is more stable compared with fluctuations in the parameters of the various layers. In addition, the thicknesses of said layers, their doping level and the width of their bandgap can be optimised depending on the application and the wavelength bands that are to be detected.

An electromagnetic radiation detector in accordance with the invention therefore comprises an array of pixels each consisting of a photodiode of the type described in relation to FIG. 1 or FIG. 4. The pixels are physically separated from each other in order to prevent any electrical short-circuit between the diodes that constitute them and in order that data collected from each junction can be localised. This partly explains why said pixels are etched in the form of mesas.

Using series-connected diodes makes it possible to use only one interconnection per pixel in order to electrically connect the detection circuit to the read-out circuit. This makes it possible to achieve maximum pixel density, which is only limited by the interconnection density.

Figure 6:
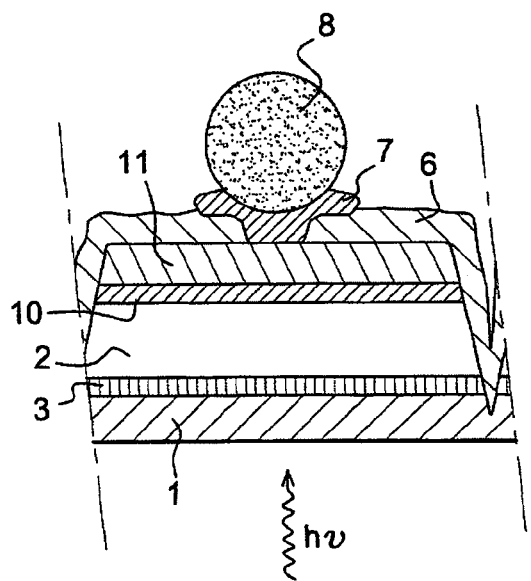
FIGS. 6 and 7 are schematic cross-sectional views of other embodiments of the invention for triple-spectrum and quad-spectrum detection respectively.

FIG. 6 shows the structure of a triple-spectrum detector in accordance with the invention. It consists of two multiheterojunction diodes of the type described above in a series-connected configuration.

One of the two diodes is reversed biased and can detect incident radiation depending on the sign of the bias voltage applied to it. The triple-spectrum detector is capable of measuring incident radiation in three different spectral bands, for example $B_1$ ($\lambda<\lambda_{c1}$), $B_2$ ($\lambda_{c1}<\lambda<\lambda_{c2}$) and $B_3$ ($\lambda_{c2}<\lambda<\lambda_{c3}$).

Each spectral band is associated with a collector layer; band $B_1$ is associated with layer (1), band $B_2$ with layer (2) and band $B_3$ with layer (11). Layers (1) and (11) associated with bands $B_1$, and $B_3$ have the same type of doping which is opposite to that of layer (2) associated with band $B_2$.

Collector layers (1, 2, 11) are separated by intermediate layers (3) and (10) respectively in order to provide multiple heterojunctions intended to make it possible to switch the diodes formed between layers (1) and (2) and (2) and (11) respectively between the two distinctive operating modes of the invention.

Four read-out modes are possible, depending on how the diodes are biased, for example:

Diode (1)-(2) reverse biased:
Mode $1_{1-2}$: detection of band $B_1$
Mode $2_{1-2}$: detection of bands $B_1+B_2$
Diode (2)-(11) reverse biased:
Mode $1_{2-11}$: detection of band $B_2$
Mode $2_{2-11}$: detection of bands $B_2+B_3$ The radiation detected in band $B_3$ can be estimated by subtracting the contribution of band $B_2$, measured in mode 1.

The triple-spectrum read-out circuit is preferably produced by epitaxially growing the various layers used and by etching into the external layer (1) in order to delimit the collection of photo carriers in each pixel.

Figure 7:
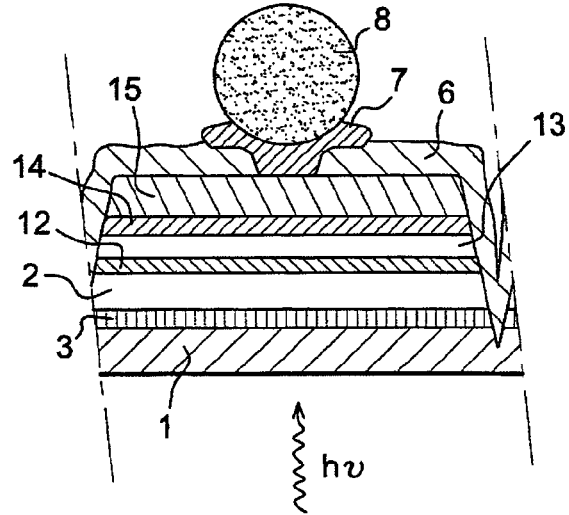

FIG. 7 shows the structure of a quad-spectrum detector in accordance with the invention. It consists of two multiheterojunction diodes of the type described above in relation to FIGS. 1 to 5, said diodes being connected in series.

This quad-spectrum detector is capable of measuring incident radiation in four different spectral bands, for example $B_1$ ($\lambda<\lambda_{c1}$), $B_2$ ($\lambda_{c1}<\lambda<\lambda_{c2}$), $B_3$ ($\lambda_{c2}<\lambda<\lambda_{c3}$) and $B_4$ ($\lambda_{c3}<\lambda<\lambda_{c4}$).

Each spectral band is associated with a collector layer; band $B_1$ is associated with layer (1), band $B_2$ with layer (2), band $B_3$ with layer (13) and band $B_4$ with layer (15).

Collector layers (1) and (15) associated with bands $B_1$ and $B_4$ have the same type of doping which is opposite to that of collector layers (2, 13) associated with bands $B_2$ and $B_3$.

Intermediate separation layers (3) and (14) formed by at least one layer of semiconductor material make the diodes formed between layers (1) and (2) and (13) and (14) switchable between the two distinctive operating modes of the invention.

Layers (2) and (13) are separated by a barrier layer (12) having the same type of doping as said layers (2, 13) in order to isolate the collection of photo carriers in the two areas that it separates.

Four read-out modes are obtained, depending on the bias voltage applied, for example:

Diode (1)-(2) reverse biased:
Mode $1_{1-2}$: detection of band $B_1$
Mode $2_{1-2}$: detection of bands $B_1+B_2$
Diode (13)-(15) reverse biased:
Mode $1_{13-15}$: detection of band $B_3$
Mode $2_{13-15}$: detection of bands $B_3+B_4$ It should be noted that modes $x_{13-15}$ are obtained by reversing the bias voltage relative to modes $x_{1-2}$.

The radiation detected in bands $B_4$ and $B_2$ can be estimated by subtracting the contributions of bands $B_1$ and $B_3$ measured in mode 1.

These triple-spectrum and quad-spectrum embodiments produced in accordance with the invention require only a single electrical interconnection per pixel (e.g. microbead (8)—the electrical contact on the rear surface of the substrate does not count) unlike devices according to the prior art which require at least two or even three connections per pixel.

Other series-connected diode type structures fall within the scope of the invention for implementing triple and quad-spectrum detectors, e.g. junctions that are switchable in accordance with the invention in an n-p-n configuration.

The semiconductor material used in the invention may, for example, consist of $Hg_{1-x}Cd_xTe$. Other examples of materials that can be used for detectors according to the invention belong to semiconductor groups III-V ($InAs_{1-x}Sbx$, $Ga_{1-x}In_xAs_{1-y}Sb_y$) or semiconductor groups IV-VI ($Pb_{1-x}Sn_xTe$ or $Pb_{1-x}Sn_xSe$).

For these various compounds, the bandgap width and cut-off wavelength can be adjusted through their composition. In $Hg_{1-x}Cd_xTe$ at 77 K, compositions x=0.225 and x=0.3 give energy gaps Eg=0.12 eV and Eg=0.24 eV, equivalent to cut-off wavelengths λc=10 μm and λc=5.1 μm respectively.

The potential barrier may, in the case of $Hg_{1-x}Cd_xTe$, have a bandgap width Eg>0.6 eV equivalent to a Cd composition x>0.52.

The quad-spectrum detection circuit is preferably produced by epitaxially growing the layers and by etching in order to delimit the collection of photo carriers in each pixel. Etching must be performed through the intermediate layer (3).

The invention allows significant simplification of the electronics required in the read-out circuit for a given number of colours or wavelengths compared with the prior art.

The invention also makes it possible to produce photodetectors, ranging up to quad-spectrum photodetectors, simply with one interconnection per pixel and a simplified read-out circuit.

The invention claimed is:

1. A semiconductor photodetector consisting of a diode with at least two heterojunctions comprising two external layers, a first layer with a given kind or type of doping and a second layer with a kind or type of doping opposite to that of the first layer respectively, the bandgap width of these two layers being determined as a function of the energy and hence the wavelength or wavelength band that they are each intended to detect, these two layers being separated from each other by an intermediate layer having the same kind or type of doping as one of said first and second layers, said diode being subjected to a bias voltage of adjustable value between the two external layers wherein the bandgap width of the intermediate layer is greater than that of the layer which has the same type of doping as the intermediate layer.

2. A semiconductor photodetector as claimed in claim 1, wherein the concentration of the doping of the intermediate layer is less than that of the external layer which has the opposite type of doping.

3. A semiconductor photodetector as claimed in claim 1, wherein the thickness of the intermediate layer is less than that of the two external layers.

4. A semiconductor photodetector as claimed in claim 1, wherein the intermediate layer is itself subdivided into several sub-layers having the same type of doping but different doping concentrations and different bandgap widths.

5. A semiconductor photodetector as claimed in claim 4, wherein the highest doping concentration of said sub-layers is located in a first sub-layer that is in contact with an external layer having a kind or type of doping that is different or opposite to that of said first sub-layer.

6. A semiconductor photodetector for obtaining multispectrum detection of electromagnetic radiation, comprising a series-connected arrangement of two multiheterojunction diodes as claimed in claim 1, and three layers to collect photons that constitute the incident radiation, the two outermost layers having the same kind or type of doping that is opposite to the type of doping of a middle layer, switching between the two operating modes of each of said heterojunction diodes and respectively being made possible by inserting an intermediate layer and respectively between the two layers that constitute said diodes.

7. A semiconductor photodetector for obtaining multispectrum detection of electromagnetic radiation, comprising a series-connected arrangement of two multiheterojunction diodes as claimed in claim 1, and four layers to collect photons that constitute the incident radiation, the two outermost layers having the same kind or type of doping that is opposite to the type of doping of the middle layers, switching between the two operating modes of each of said heterojunction diodes and respectively being made possible by inserting an intermediate layer respectively between the two layers that constitute the diodes, middle collector layers being also separated by a barrier layer having the same type of doping as said layers in order to isolate the collection of photo carriers in the two areas that it separates.

8. A multispectrum electromagnetic radiation detection device, comprising an array of pixels each consisting of a photodetector as claimed in claim 1.

9. A multispectrum electromagnetic radiation detection device as claimed in claim 8, wherein said pixels are connected to a read-out circuit by means of hybridisation using indium beads.

10. A method for using a multispectrum detection device that contains photodetectors as claimed in claim 1, comprising:
applying a first voltage to said device in order to detect the photo carriers created in the external layer that is differently or oppositely doped to the intermediate layer;
then applying a second voltage having a value higher than that of said first voltage in order to detect the photo carriers created in the two external layers; and
then subtracting the two quantities thus obtained in order to determine the number of photo carriers created by the second external layer.

\* \* \* \* \*